United States Patent
Schaepkens

(10) Patent No.: US 6,681,716 B2
(45) Date of Patent: Jan. 27, 2004

(54) APPARATUS AND METHOD FOR DEPOSITING LARGE AREA COATINGS ON NON-PLANAR SURFACES

(75) Inventor: Marc Schaepkens, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 101 days.

(21) Appl. No.: 09/683,148

(22) Filed: Nov. 27, 2001

(65) Prior Publication Data

US 2003/0097988 A1 May 29, 2003

(51) Int. Cl.$^7$ .................. C23C 16/00; H05H 1/00
(52) U.S. Cl. .................. 118/723 DC; 118/723 E; 156/345.33; 156/345.34
(58) Field of Search .............. 118/723 E, 723 DC, 118/718, 728, 729, 727, 726, 723 CB, 723 EB; 156/345.33, 345.34; 438/788; 427/393.4, 450, 38

(56) References Cited

U.S. PATENT DOCUMENTS

| | | | |
|---|---|---|---|
| 4,871,580 A | | 10/1989 | Schram et al. |
| 4,957,062 A | | 9/1990 | Schuurmans et al. |
| 5,120,568 A | | 6/1992 | Schuurmans et al. |
| 5,560,779 A | * | 10/1996 | Knowles et al. ...... 118/723 MP |
| 6,013,155 A | * | 1/2000 | McMillin et al. ...... 156/345.43 |
| 6,143,078 A | * | 11/2000 | Ishikawa et al. ............ 118/715 |
| 6,213,049 B1 | | 4/2001 | Yang |
| 6,383,953 B2 | * | 5/2002 | Hwang ........................ 438/788 |
| 6,397,776 B1 | * | 6/2002 | Yang et al. ............ 118/723 MP |
| 6,487,986 B1 | * | 12/2002 | Liehr et al. ......... 118/723 MW |

FOREIGN PATENT DOCUMENTS

JP    63-187619 A   *  8/1998   ......... H01L/21/205

OTHER PUBLICATIONS

"Temperature and Growth–Rate Effects on the Hydrogen Incorporation in Hydrogenated Amorphous Silicon", WMM Kessels et al., Department of Applied Physics, Eindhoven University of Technology, 1998, pp 29–33.

"Improvement of Hydrogenated Amorphous Silicon Properties With Increasing Contribution of $SiH_3$ to Film Growth", WMM Kessels et al., Department of Applied Physics, Eindhoven University of Technology, pp 107–110.

Application Ser. No. 09/681,820, filed Jun. 11, 2001, "Apparatus and Method for Large Area Chemical Vapor Deposition Using Multiple Expanding thermal Plasma Generators".

Specification RD–28,667—"Apparatus and Method for Depositing Large Area Coatings on Planar Surfaces", Marc (NMN) Schaepkens, S/N 09/683,149.

* cited by examiner

Primary Examiner—Parviz Hassanzadeh
(74) Attorney, Agent, or Firm—Robert P. Santandrea; Patrick K. Patnode

(57) ABSTRACT

A method and apparatus for depositing a uniform coating on a large area, non-planar surface using an array of multiple plasma sources. The apparatus comprises at least one array of a plurality of plasma sources for generating a plurality of plasmas, wherein each of the plurality of plasma sources has a cathode, anode, and an inlet for a non-reactive plasma source gas disposed in a plasma chamber, and at least one reactant gas injector for differentially injecting at least one reactant gas into the plurality of plasmas. The reactant gas injector and substrate are located in a deposition chamber in fluid communication with each plasma chamber. Individual adjustment of the flow of deposition precursor into each of the plasmas generated by the multiple plasma array compensates for changes in substrate processing conditions due to local variations in the working distance between the plasma source and the surface of the substrate.

34 Claims, 7 Drawing Sheets

APPARATUS AND METHOD FOR DEPOSITING LARGE AREA COATINGS ON NON-PLANAR SURFACES

BACKGROUND OF INVENTION

The invention relates to an apparatus and method for depositing a uniform coating on a surface of a substrate. More particularly, the invention relates to a method and apparatus for depositing a uniform coating on a surface using multiple plasma sources. Even more particularly, the invention relates to a method and apparatus for depositing a uniform coating on a surface of a substrate using multiple expanding thermal plasma sources.

Plasma sources are capable of depositing a large variety of coatings, such as transparent abrasion resistant coatings, transparent UV-filtering coatings, and multi-layer coating packages on a substrate at a high deposition rate. Individual plasma sources, such as expanding thermal plasma (also referred to hereinafter as "ETP") sources, can be used to uniformly coat areas having a diameter in the range of about 10–15 cm.

Arrays of multiple plasma sources may be used to coat larger substrate areas. Such large area coating work typically deals with depositing a coating on macroscopically flat surfaces. The substrate can be coated by translating it in a back and forth, up and down pattern—or "scanned"—in front of an array of multiple plasma sources. Deposition precursors are usually provided to the multiple plasma sources at the same rate. In this situation it is possible to fabricate large area, uniform coatings. To achieve a uniform coating on a planar surface, the multiple plasma sources may be spaced in a two-dimensional pattern, such as a linear or zigzag array.

When an array of plasma sources is used to coat a large non-planar surface, however, coating uniformity is adversely affected by the dependence of the coating rate upon variations in the source-to-substrate—or working—distance. Thus, those areas on the substrate that are located further away from the plasma source array are coated at a lower rate. The differences in the coating rate across the surface of a substrate results in a non-uniform coating of the substrate.

Arrays of multiple plasma sources are unable to uniformly coat such large non-planar surfaces. Therefore, what is needed is a method and apparatus for uniformly coating a large area surface of a substrate using multiple plasma sources.

SUMMARY OF INVENTION

The present invention meets these and other needs by providing both a method and apparatus for depositing a uniform coating on a large area, non-planar surface using an array of multiple plasma sources. By locally adjusting the flow of deposition precursor into each of the plasmas generated by the multiple plasma array, the invention compensates for changes in substrate processing conditions due to local variation in the working distance between the plasma source and the substrate surface.

Accordingly, one aspect of the invention is to provide an apparatus for depositing a uniform coating on a surface of a substrate. The apparatus comprises: at least one array of a plurality of plasma sources for generating a plurality of plasmas, wherein each of the plurality of plasma sources includes a cathode, an anode, and an inlet for a non-reactive plasma source gas disposed in a plasma chamber which is maintained at a first predetermined pressure; a deposition chamber for containing the substrate, wherein the deposition chamber is in fluid communication with the plasma chamber, and wherein the deposition chamber is maintained at a second predetermined pressure that is less than the first predetermined pressure; and at least one reactant gas injector disposed in the deposition chamber for providing a differential flow rate of at least one reactant gas into each of the plurality of plasmas.

A second aspect of the invention is to provide a reactant gas injector for injecting at least one reactant gas into a plurality of plasmas generated by an array of a plurality of plasma sources such that a first flow rate of the at least one reactant gas into a first plasma generated by a first plasma source in the array is different from a second flow rate of the at least one reactant gas into a second plasma generated by a second plasma source in the array. The reactant gas injector comprises: at least one reactant gas inlet comprising a tubular-walled structure having an interior space through which the at least one reactant gas is supplied from a reactant gas source; a first plurality of orifices proximate to the first plasma, each of the first plurality of orifices extending through the tubular-walled structure from the interior space to an outer surface of the at least one reactant gas inlet, and a second plurality of orifices proximate to the second plasma, each of the second plurality of orifices extending through the tubular-walled structure from the interior space to an outer surface of the at least one reactant gas inlet. The first plurality of orifices is oriented such that the at least one reactant gas passes from the interior space through the first plurality of orifices and is directed into the first plasma at a first predetermined flow rate and the second plurality of orifices is oriented such that the at least one reactant gas passes from the interior space through the second plurality of orifices and is directed into the second plasma at a second predetermined flow rate.

A third aspect of the invention is to provide an apparatus for depositing a uniform coating on a surface of a substrate. The apparatus comprises: at least one array of a plurality of plasma sources for generating a plurality of plasmas, wherein each of the plurality of plasma sources includes a cathode, an anode, and an inlet for a non-reactive plasma source gas disposed in a plasma chamber which is maintained at a first predetermined pressure; a deposition chamber for containing the substrate, wherein the deposition chamber is in fluid communication with the plasma chamber, and wherein the deposition chamber is maintained at a second predetermined pressure that is less than the first predetermined pressure; and at least one reactant gas injector for injecting at least one reactant gas into the plurality of plasmas such that a first flow rate of the at least one reactant gas into a first plasma generated by a first plasma source in the at least one array is different from a second flow rate of said at least one reactant gas into a second plasma generated by a second plasma source in the at least one array. The at least one reactor injector comprises: at least one reactant gas inlet comprising a tubular-walled structure having an interior space through which the at least one reactant gas is supplied from a reactant gas source; a first plurality of orifices proximate to the first plasma, each of the first plurality of orifices extending through the tubular-walled structure from the interior space to an outer surface of the reactant gas inlet, wherein the first plurality of orifices is oriented such that the at least one reactant gas passes from the interior space through the first plurality of orifices and is directed into said first plasma; and a second plurality of orifices proximate to the second plasma, each of the second plurality of orifices extending through the tubular-walled structure from the interior space to an outer surface of the at least one reactant gas inlet, wherein the second plurality of orifices is oriented such that the at least one reactant gas passes from the interior space through the second plurality of orifices and is directed into the second plasma.

A fourth aspect of the invention is to provide a method of depositing a uniform coating on a surface of a substrate. The method comprises the steps of: providing the substrate having the surface to a deposition chamber; evacuating the deposition chamber to a predetermined deposition pressure; generating a plurality of plasmas from at least one array of a plurality of plasma sources; injecting a reactant gas into each of the plurality of plasmas such that a first flow rate of the at least one reactant gas into a first plasma is different from a second flow rate of the at least one reactant gas into a second plasma; flowing the at least one reactant gas and the plurality of plasmas into the deposition chamber toward the substrate; and reacting the at least one reactant gas with the plurality of plasmas to form the coating on the surface of the substrate.

A fifth aspect of the invention is to provide a method of injecting at least one reactant gas into a plurality of plasmas generated by an array of a plurality of plasma sources such that a first flow rate of the at least one reactant gas into a first plasma is different from a second flow rate of the at least one reactant gas into a second plasma. The method comprises the steps of: supplying the at least one reactant gas from at least one reactant gas source to at least one reactant gas injector; passing the at least one reactant gas through a first plurality of orifices in the at least one reactant gas injector proximate to the first plasma, wherein the first plurality of orifices is oriented such that the at least one reactant gas is directed into the first plasma at a first predetermined flow rate; and passing the at least one reactant gas through a second plurality of orifices in the at least one reactant gas injector proximate to the second plasma, wherein the second plurality of orifices is oriented such that the at least one reactant gas is directed into the second plasma at a second predetermined flow rate.

A sixth aspect of the invention is to provide a non-planar substrate having a uniform coating deposited on a surface, wherein the uniform coating is deposited by: providing the substrate having the surface to a deposition chamber, wherein the deposition chamber is in fluid communication with at least one array of a plurality of plasma sources, wherein at least one of the plurality of plasma sources is an expanding thermal plasma source having a cathode, an anode and an inlet for a non-reactive plasma source gas disposed in a plasma chamber, the plasma chamber being in fluid communication with the deposition chamber; evacuating the deposition chamber to a predetermined deposition pressure and the plasma chamber to a predetermined first pressure, wherein the predetermined deposition pressure is less than the predetermined first pressure; generating a plurality of plasmas in the plurality of plasma sources and flowing the plurality of plasmas into said deposition chamber; injecting at least one reactant gas into each of the plurality of plasmas as the plurality of plasmas flows into the deposition chamber such that a first flow rate of the at least one reactant gas into a first plasma is different from a second flow rate of the at least one reactant gas into a second plasma; flowing the at least one reactant gas and the plurality of plasmas into the deposition chamber toward the substrate; and reacting the at least one reactant gas with each of the plurality of plasmas to form the coating on the surface of the substrate.

These and other aspects, advantages, and salient features of the present invention will become apparent from the following detailed description, the accompanying drawings, and the appended claims.

BRIEF DESCRIPTION OF DRAWINGS

FIG. 1b is a schematic representation showing the effect obtained when a coating is deposited on a macroscopically non-planar substrate by the apparatus shown in FIG. 1a;

DETAILED DESCRIPTION

Figure 1A:
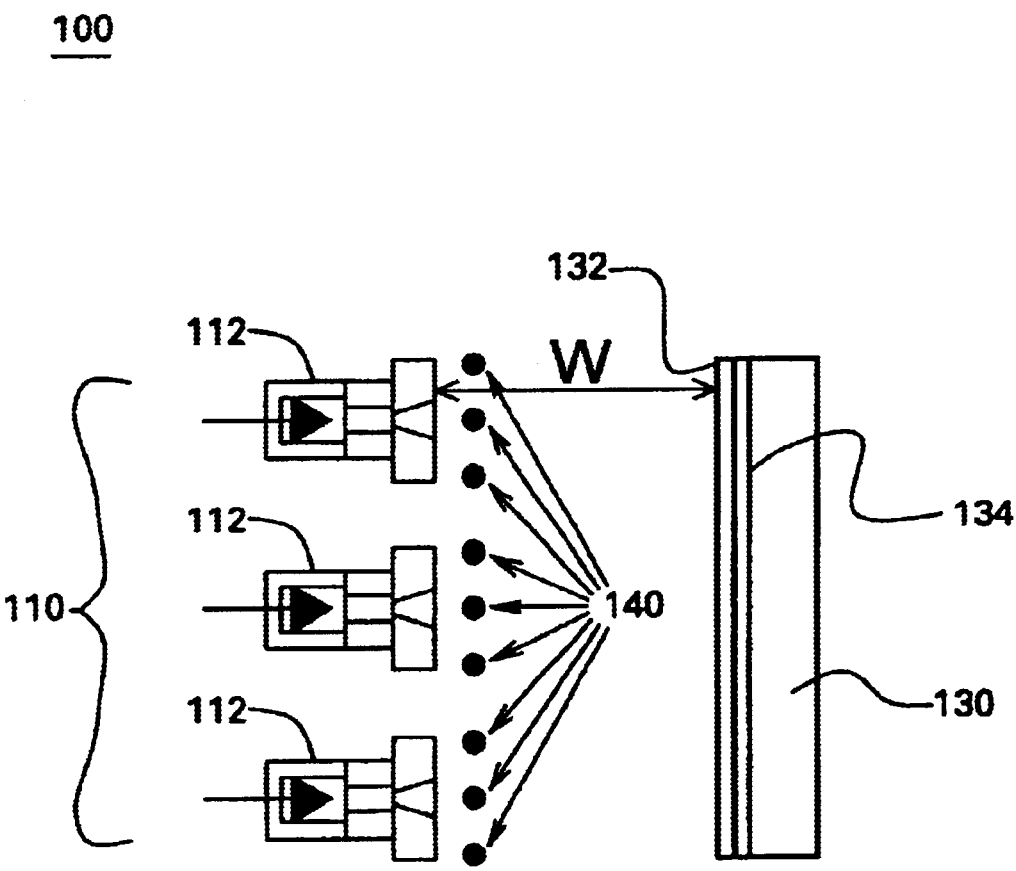
FIG. 1a is schematic representation of an apparatus for depositing a uniform coating on a macroscopically planar surface using a plurality of expanding thermal plasma sources.

In the following description, like reference characters designate like or corresponding parts throughout the several views shown in the figures. It is also understood that terms such as "top," "bottom," "outward," "inward," and the like are words of convenience and are not to be construed as limiting terms.

Referring to the drawings in general and to FIG. 1 in particular, it will be understood that the illustrations are for the purpose of describing a preferred embodiment of the invention and are not intended to limit the invention thereto. An apparatus 100 for depositing a uniform coating on a macroscopically planar—or flat—surface using a plurality of expanding thermal plasma sources is schematically shown in FIG. 1a. The apparatus 100 shown in FIG. 1a has been described in "Apparatus and Method for Large Area Chemical Vapor Deposition Using Expanding Thermal Plasma Generators," U.S. patent application Ser. No. 09/681,820, by Barry Lee-Mean Yang et al., now U.S. Pat. No. 6,397,776, and in "Large Area Plasma Coating Using Multiple Expanding Thermal Plasma Sources in Combination with a Common Injection Source," U.S. patent application Ser. No. 09/683,148, by Max Schaepkens, both of which are incorporated herein by reference in their entirety. A coating 132 is deposited on the surface 134 of a planar substrate 130 as the planar substrate 130 is scanned in front of an array 110 of a plurality of expanding thermal plasma (hereinafter also referred to as "ETP") sources 112. Alternatively, substrate 130 may be statically mounted in front of array 110. Each of the plurality of ETP sources 112 is supplied with at least one reactant gas injector 140 that injects a reactant gas into each of the plurality of plasmas generated by each of the plurality of ETP sources 112. The reactant gas then reacts with the generated ETP to form coating 132. The at least one reactant gas is supplied at the same flow rate to each of the plurality of ETP sources 112 to produce a coating having uniform properties, as represented by the uniform distribution or linear density of reactant gas injectors in FIG. 1a.

It is generally desirable to produce a coating having a uniform profile of at least one selected property across the entire coated surface. Such properties include, but are not limited to, coating thickness, abrasion resistance, radiation absorption, and radiation reflectivity. The profiles of such properties in a coating deposited by a single plasma source, such as an ETP source, have a Gaussian distribution about the axis of the plasma source. The profile is proportional to the working distance w, which is the distance between an individual plasma source 112 and the surface 134. For example, with a fixed flow rate of reactant gas, the thickness of the deposited coating 132 increases as w decreases, while the width or Gaussian distribution of coating 132 (or the surface area covered by coating 132) decreases. Conversely, for a fixed flow rate of reactant gas, the thickness of the deposited coating 132 decreases as w increases, while the width of coating 132 (or surface area covered by coating 132) increases with increasing w.

Figure 1B:
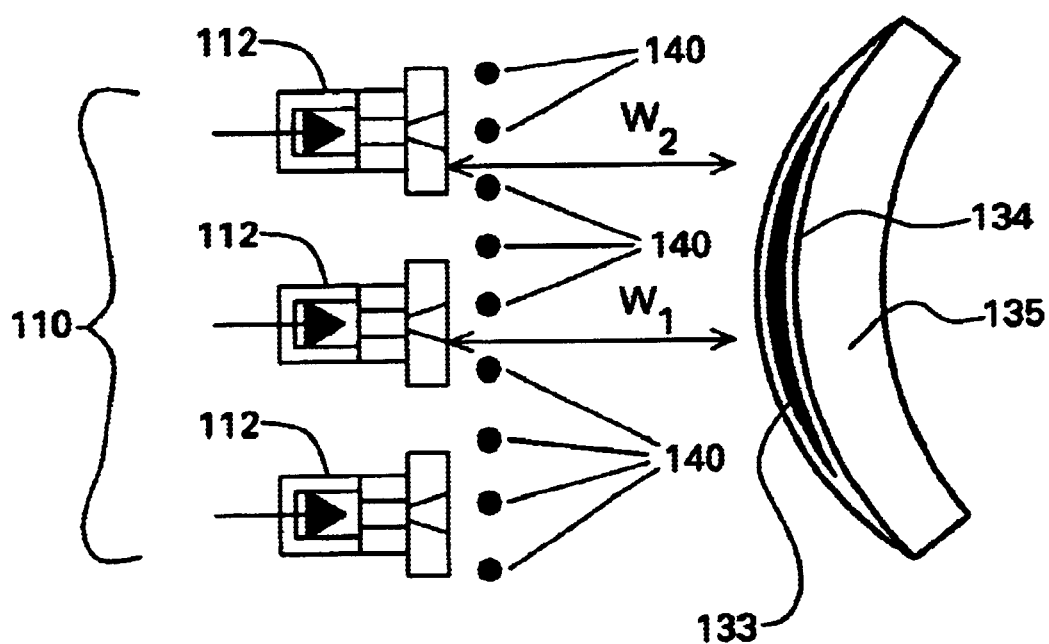

For a planar substrate, a uniform profile of a given property can be obtained by arranging the plurality of plasma sources in an array such that the Gaussian distributions produced by the individual plasma sources overlap. However, when a macroscopically non-planar substrate 135, which is schematically represented in FIG. 1b, is coated using the array 110 and reactant gas injectors 140 shown in apparatus 100, a non-uniform coating 133 will be deposited as a result of the dependence of the deposition process upon the working distance w between an individual plasma source 112 and the surface 134. Due to the non-planar nature of the surface 134, the working distance w—and thus the Gaussian profile—changes as the non-planar surface is scanned across the plurality of plasma sources 112 in array 110. In particular, those portions of the surface of the substrate that are further away from a plasma source will be coated at a lower rate, resulting in the deposition of a non-uniform coating 133 on non-planar substrate 135. In FIG. 1b, for example, due to the curvature of surface 133 of substrate 135, working distance $w_1$ is less than working distance $w_2$. The thickness of coating 133 is greater in the region where coating 133 is deposited by plasma source 110 having a working distance $w_1$ than in the region where coating 133 is deposited by plasma source 110 having a greater working distance $w_2$.

Unless parameters such as flow rate or linear density of orifices in reactant gas injector 140 are used to compensate for differences in working distance w, a non-uniform coating 133 will be deposited on surface 134.

In one embodiment, the present invention compensates for changes in the working distance w by either reducing or increasing the flow rate of reactant gases into each of the plurality of plasmas. Generally, the flow rate through an orifice, or a plurality of orifices, is proportional to the ratio of the pressure drop ΔP across the orifice to the conductance of the orifice:

Flow Rate∝ΔP/conductance.

Thus, coating uniformity on a non-planar surface may be achieved by differentially controlling the flow rate of at least one reactant gas into each of the plurality of plasmas generated by a plurality of plasma sources arranged in at least one array. The flow rate of reactant gases may in turn be varied by changing either the pressure drop ΔP across the plurality of orifices or the conductance of the plurality of orifices.

Figure 2:
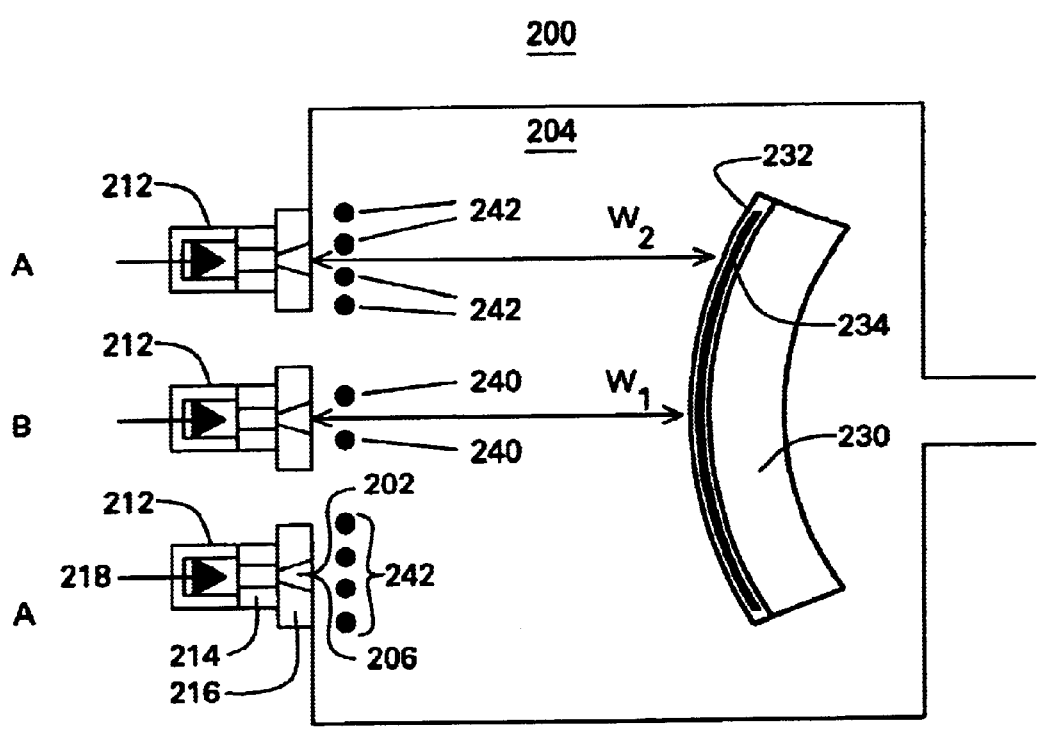
FIG. 2 is a schematic representation of an apparatus for depositing a uniform coating on a non-planar surface according to the present invention.

An apparatus 200 for depositing a uniform coating on a non-planar surface according to the present invention is shown in FIG. 2. The apparatus 200 includes at least one array 210 of a plurality of plasma sources 212. The apparatus may include as many arrays as is practical and necessary for coating non-planar substrate 230. Similarly, each array 210 may include as many plasma sources 212 as is practical or necessary to deposit the desired coating 232 or coatings on substrate 230. For example, an additional array (not shown) of a plurality of plasma sources 212 may be located so as to coat a surface of substrate 230 opposite surface 232. In one embodiment, the plurality of plasma sources 210 includes at least one ETP plasma source. While FIG. 2 shows a single array 210 having only three plasma sources 212, multiple arrays 210 and at least one array 210 having more than three plasma sources 212 are also contemplated. Array 210, for example, may include up to about 12 plasma sources 212. The array 210 may be a two-dimensional array, such as a linear, staggered, or zig-zag array, of plasma sources 212. Alternatively, array 210 may be a three-dimensional array of plasma sources 212.

Each of the plurality of plasma sources 212 includes a cathode housing 214, an anode 216, and a plasma source gas inlet 218, which are disposed in a plasma chamber 202. The plasma source gas is an inert gas, such as a noble gas; i.e., argon, helium, neon, krypton, or xenon. Alternatively, other chemically unreactive gases, such as, but not limited to, nitrogen and hydrogen, may be used as the plasma source gas. Preferably, argon is used as the plasma source gas. A plasma is generated at each of the plurality of plasma sources 212 by striking an arc between cathode 214 and anode 216, while introducing the plasma source gas into the arc through plasma source gas inlet 218.

In one embodiment, at least one of the plurality of plasma sources 212 is an expanding thermal plasma ("ETP"). In an ETP, a plasma is generated by ionizing the plasma source gas in the arc generated between the cathode and anode to produce a positive ion and an electron. The following reaction, for example, occurs when an argon plasma is generated:

$Ar \rightarrow Ar^+ + e^-$.

The plasma is then expanded into a high volume at low pressure, thereby cooling the electrons and positive ions. In the present invention, the plasma is generated in plasma chamber 202 and expanded into deposition chamber 204 through opening 206. As previously described, deposition chamber 204 is maintained at a significantly lower pressure than the plasma chamber 202. Consequently, the electrons in the ETP are too cold and thus have insufficient energy to cause direct dissociation of the at least one reactant gas within the ETP. Instead, the at least one reactant gas that is introduced into the plasma may undergo charge exchange and dissociative recombination reactions with the electrons within the ETP. In an ETP, the positive ion and electron temperatures are approximately equal and in the range of about 0.1 eV (about 1000 K). In other types of plasmas, the electrons have a sufficiently high temperature to substantially affect the chemistry of the plasma. In such plasmas, the positive ions typically have a temperature of about 0.1 eV, and the electrons have a temperature of about 1 eV, or 10,000 K.

Plasma chamber 202 and deposition chamber 204 are in fluid communication with each other through opening 206. Deposition chamber 204 is in fluid communication with a vacuum system (not shown), which is capable of maintaining the deposition chamber at a pressure that is lower than that of the plasma chamber 202. In one embodiment, the deposition chamber 204 is maintained at a pressure of less than about 1 torr (about 133 Pa) and, preferably, at a pressure of less than about 100 millitorr (about 0.133 Pa), while plasma chamber 202 is maintained at a pressure of at least about 0.1 atmosphere (about $1.01 \times 10^4$ Pa).

At least one reactant gas injector 220 is located in deposition chamber 204 for providing at least one reactant gas at a predetermined flow rate into each of the plurality of plasmas generated by the plurality of plasma sources 212 in array 210. The at least one reactant gas is provided to the at least one reactant gas injector 220 from at least one reactant gas source (not shown) by a reactant gas injector system (not shown). The at least one reactant gas is provided through the at least one reactant gas injector 220 to each of the plurality of plasmas as the plasmas enter into the deposition chamber 204 through opening 206. The at least one reactant gas may comprise a single reactant gas or a mixture of reactant gases. The at least one reactant gas may be provided from a single reactant gas source or separate, multiple reactant gas sources to either a single reactant gas injector system or separate reactant gas injector systems.

Figure 3:
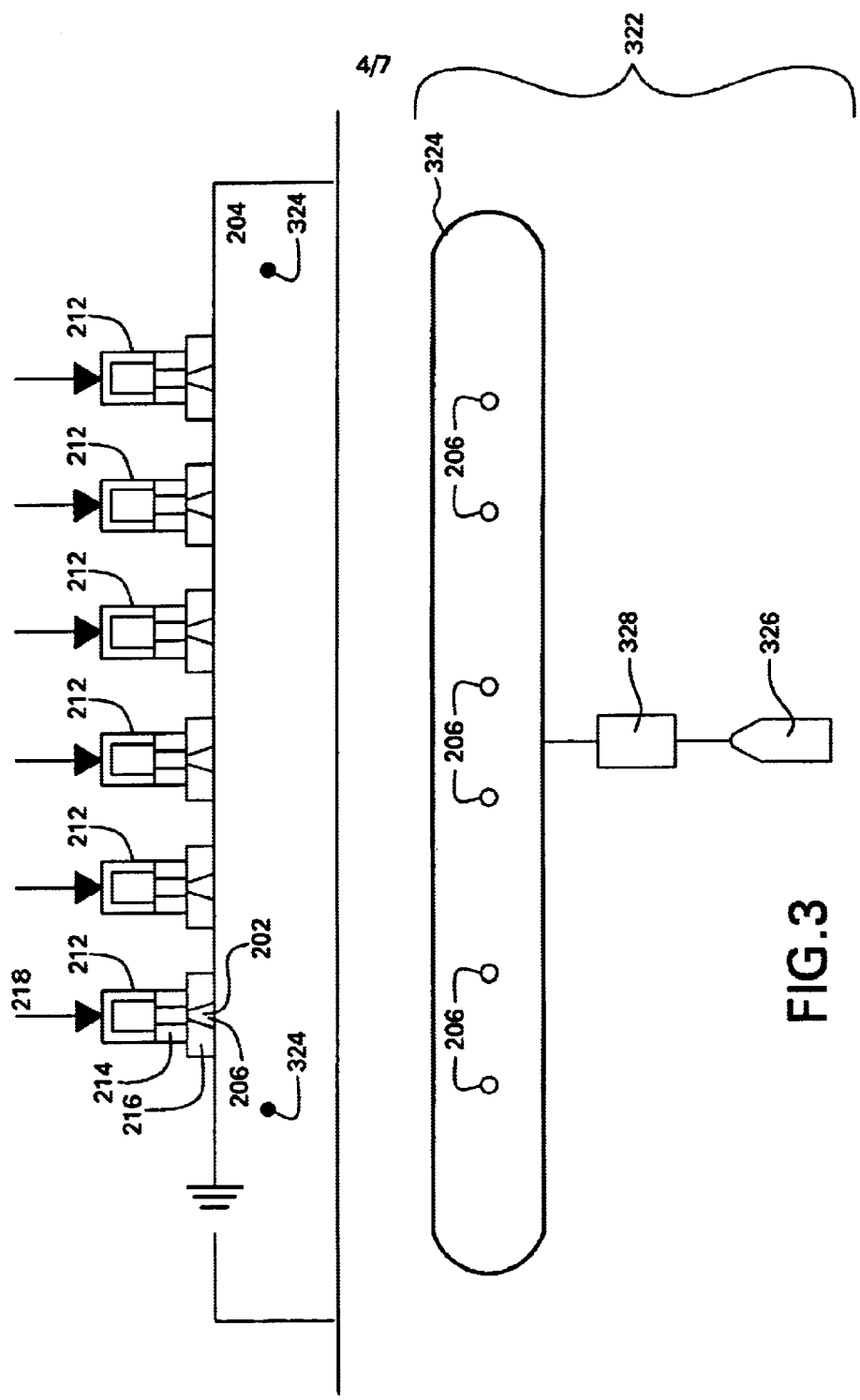
FIG. 3 is a schematic representation of an apparatus of the present invention in which a reactant gas is provided to a plurality of plasma sources in an array by a common reactant gas injector system.

FIG. 3 shows a top and side view of one embodiment of the present invention in which a common reactant gas injector system 322 serves all of the plurality of plasma sources 212 in array 210. In this embodiment, the common reactant gas injector system 322 comprises a common injector ring 324, which is formed from a tubular-walled structure having an interior space through which the at least one reactant gas is supplied from a reactant gas source 326 to each of the plurality of plasmas. Common reactant gas injector system 322 may include at least one mass flow controller 328 located between reactant gas source 326 and common injector ring 324. Preferably, common injector ring 324 is formed from stainless steel tubing having a thickness of about ⅝ inch (about 15.9 mm). The common injector ring 324 includes a plurality of orifices located proximate to each of the plurality of plasmas exiting plasma chamber 202 through opening 206. Each of the plurality of orifices extends through the tubular-walled structure from the interior space to an outer surface of the common injector ring 324. The plurality of orifices is oriented such that the at least one reactant gas passes from the interior space through said the plurality of orifices and is directed into the each of the plurality of plasmas as the exit openings 206.

Differential control and delivery of the at least one reactant gas to each of the individual plasmas may be accomplished by providing a common injector ring 324, such as that schematically shown in FIG. 3, in which the linear orifice density (i.e., the number of orifices per unit length of the injector ring) is varied as a function of working distance w. By varying the linear orifice density along common injector ring 324 according to variations in working distance w while maintaining the pressure of the at least one reactant gas within the common injector ring 324 at a constant value, the flow rate of the at least one reactant gas into each of the plurality of plasmas can be adjusted to obtain a coating having overall uniform properties. For example, in the instance where the working distance w for one of the plurality of plasma sources 212 is greater than that of adjacent plasma sources, the linear orifice density of injector ring 324 would be greater proximate to the more distant plasma source than it would be proximate to plasma sources having a smaller working distance. The variation of linear orifice density with working distance w is schematically shown in FIG. 2. As seen in FIG. 2, plasma source A has a working distance $w_1$ that is less than working distance $w_2$ for plasma sources B. To obtain uniform coating 235 on non-planar substrate 230, the number of orifices 240 provided for the plasma generated by plasma source A (having working distance $w_1$) is less than the number of orifices 242 provided for the plasma generated by plasma source B (having working distance $w_2$ greater than $w_1$).

In one embodiment, common injector ring 324 includes threaded holes that are spaced about 0.5 inch (about 12.7 mm) apart to allow for the insertion of a set-screw having an orifice machined therethrough. The orifice may have a diameter of about 0.040 inch (about 1.02 mm). The linear orifice density along injector ring 324 can be varied to achieve differential flow injection by replacing some of the set-screws having orifices with regular set-screws into which no orifices have been machined. In addition, radial injection location may be varied by using extended set-screws with orifices.

Alternatively, differential delivery and control of reactant gases to each of the individual plasmas generated by the plurality of plasma sources 212 may be accomplished by adjusting the conductance of the orifices in the common injector ring 324 to compensate for variations in working distance w. Common injector ring 324 may be provided with orifices having diameters or lengths (i.e., the length of the orifice through the tubular-walled structure) that are varied as a function of working distance w. By so varying the diameters or the lengths of the orifices, the flow rate of the at least one reactant gas into each of the plurality of plasmas can be adjusted to obtain a coating having an overall uniform profile. For example, in the instance where the working distance w for one of the plurality of plasma sources 212 is greater than that of adjacent plasma sources 212, the orifices in common injector ring 324 proximate to the more distant plasma source would have larger diameters than those orifices that are proximate to plasma sources having smaller working distances. Referring again to FIG. 2, for example, the individual diameters of orifices 242 would be greater than the individual diameters of orifices 240, as working distance $w_2$ is greater than $w_1$.

Figure 4:
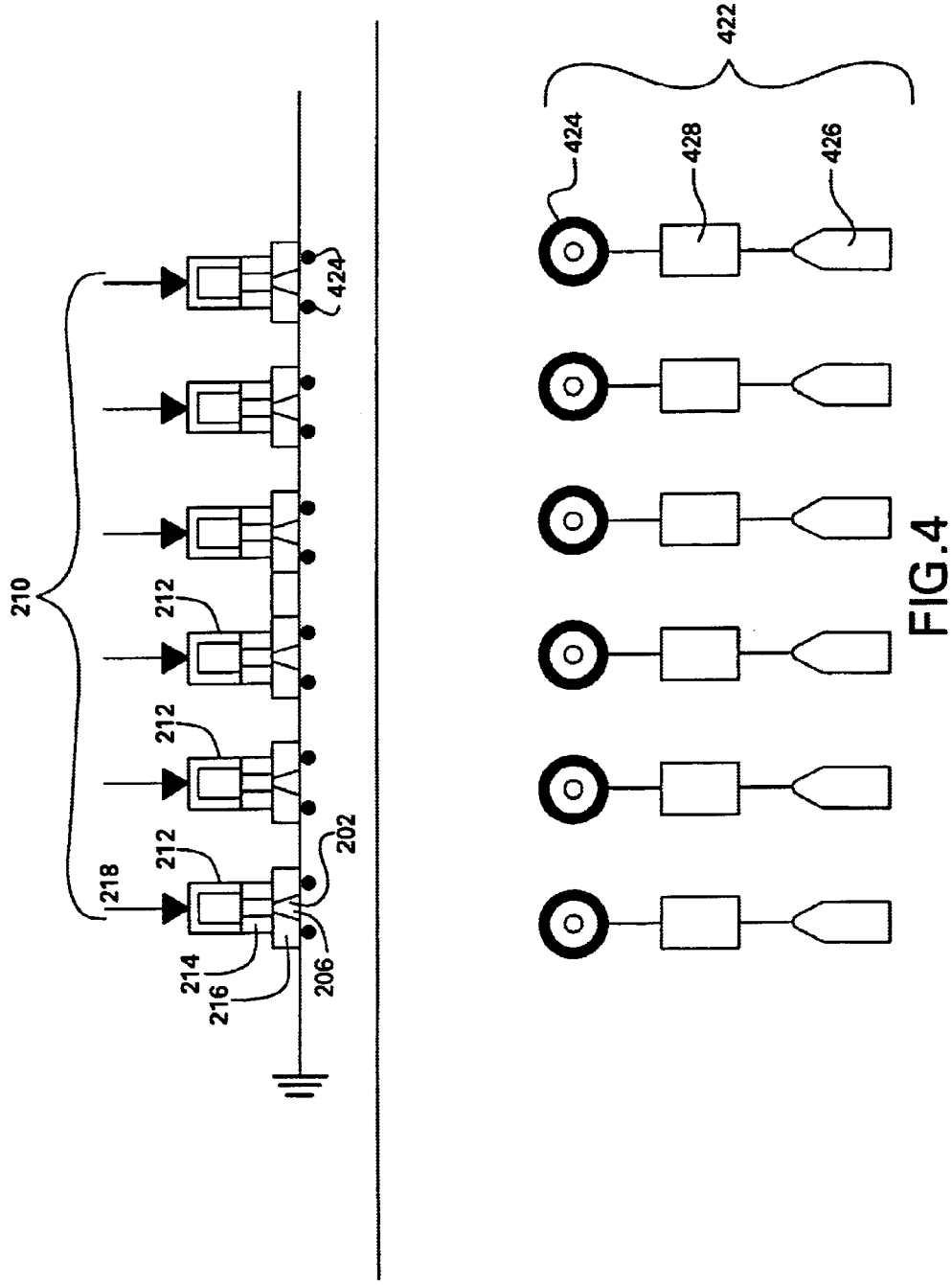
FIG. 4 is a schematic representation of an apparatus of the present invention in which a reactant gas is provided to a plurality of plasma sources in an array by individual reactant gas injectors.

In another embodiment, each of the plurality of plasma sources 212 may be provided with a separate, independently controllable reactant gas injector system 422 for introducing the at least one reactant gas into each of the plurality of plasmas, as shown in top and side views in FIG. 4. Although FIG. 4 shows each of the plurality of plasma sources 212 provided with an individual reactant gas injector ring 424, each of the individual reactant gas injector systems 422 may comprise at least one nozzle-type injector (not shown), injector ring 424, or the like. In this embodiment of the invention, differential delivery and control of the at least one reactant gas to each of the plurality of plasmas may be achieved by individually and independently controlling the mass flow rate of the at least one reactant gas from individual reactant gas sources 426 to each individual reactant gas injector system 422 by individual mass flow controllers 428. Alternatively, the reactant gas or mixture of reactant gases may provided from a single reactant gas source (not shown) with the flow to each of the individual injectors 424 controlled by individual mass flow controllers 428. The mass flow rate of the at least one reactant gas may controlled as a function of time in order to compensate for changes in working distance w as the non-planar substrate 230 is scanned in front of the at least one array 210. If the individual reactant gas injector system comprises at least one individual injector ring 424, differential delivery and control can additionally be achieved by using individual ring injectors 424 having either different linear orifice densities or orifices of different sizes or conductances. If nozzle-type injectors are used, differential delivery and control can additionally be achieved by providing nozzles of different sizes to the individual reactant gas injector systems.

Once injected into each of the plurality of plasmas, the at least one reactant gas undergoes a reaction within each of the plurality of plasmas. Such reactions may include, but are not limited to, charge exchange reactions, dissociative recombination reactions, and fragmentation reactions. Products from reactions that occur within the plurality of plasmas then combine to deposit a coating 232 on surface 234 of substrate 230, which is contained in deposition chamber 204. Substrate 230 may either be statically mounted to a substrate holder (not shown) or coupled to a movement actuator (not shown), which translates (or 'scans') the substrate 230 with respect to the at least one array 210.

The following example serves to illustrate the features and advantages offered by the present invention, and is not intended to limit the invention thereto.

EXAMPLE

Experimental support for the invention is provided by carrying out experiments in which the precursor flow and the working distance w were varied. The substrate used was a flat polycarbonate substrate, as to better control the effects of these parameters. The ETP source was provided with a injector ring located in the expansion, or deposition, chamber and the reactant gas, or deposition precursor, was vinyltrimethylsilane (hereinafter referred to as "VTMS"). Flow between the VTMS reservoir to the injector ring was regulated and the pressure within the injector ring was monitored. The deposition experiments were performed using either 6 or 12 orifices in the injector ring. The ETP source was fed with 2 slm of argon and a current of 70 A was sent from the cathode to the anode of the ETP source to generate the thermal argon plasma. The pressure in the ETP source, or plasma, chamber was about 600 torr, whereas the pressure in the expansion chamber was about 35 millitorr.

Figure 5:
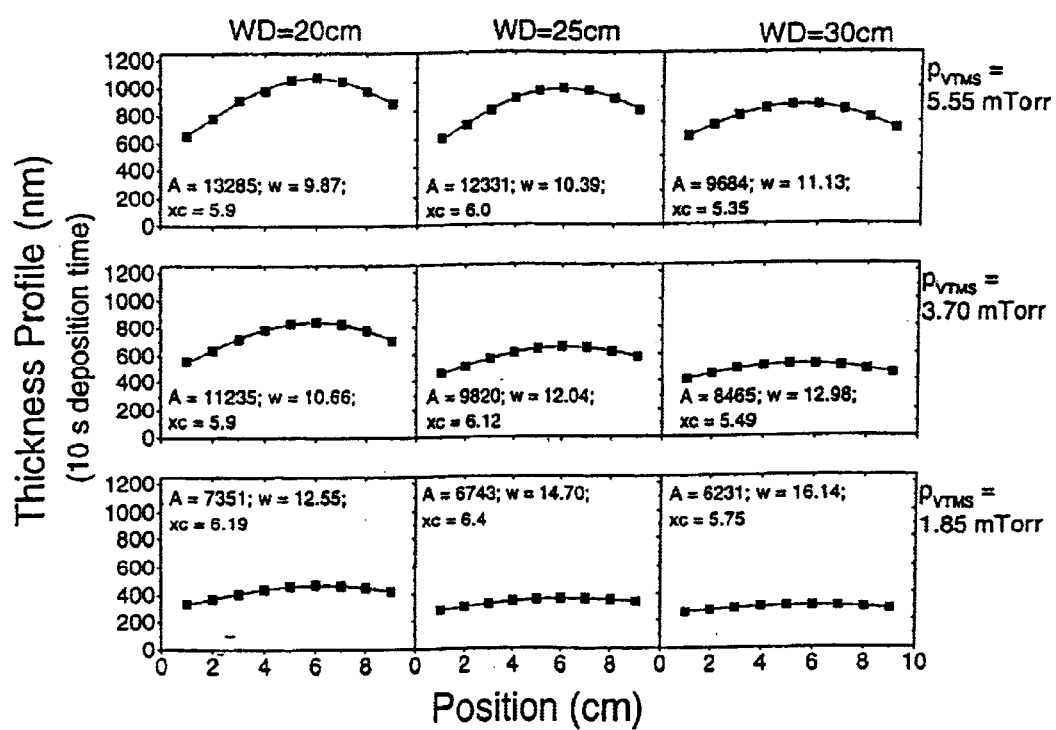
FIG. 5 is a plot of the dependence of coating thickness upon working distance and reactant gas flow rate.

The coating thickness profiles obtained after 10 seconds of deposition using an injector ring having 12 orifices are shown in FIG. 5 for working distances of 20, 25, or 30 cm and VTMS partial pressures in the expansion chamber of 5.55, 3.7, and 1.85 millitorr, respectively. The solid points represent the experimental data and the line is a Gaussian fit through the data. The area A under the Gaussian fit is a measure of the coating thickness deposited during one scan of the substrate in front of the ETP source, and the width w of the Gaussian fit is a measure of the uniformity of the single ETP source deposition profile. The resulting values for area A and width w are included in FIG. 5.

As seen in FIG. 5, when the working distance w decreases from 30 to 20 cm, the deposited coating thickness, which is proportional to area A, increases while the single ETP source uniformity, i.e., width w, decreases. FIG. 5 also shows that a reduction in flow rate—i.e., a reduction in partial VTMS pressure—can be used to compensate for the effect of decreasing the working distance w on the deposition profile; namely, the lower the VTMS flow, the lower the deposited thickness and the more uniform the profile.

Figure 6:
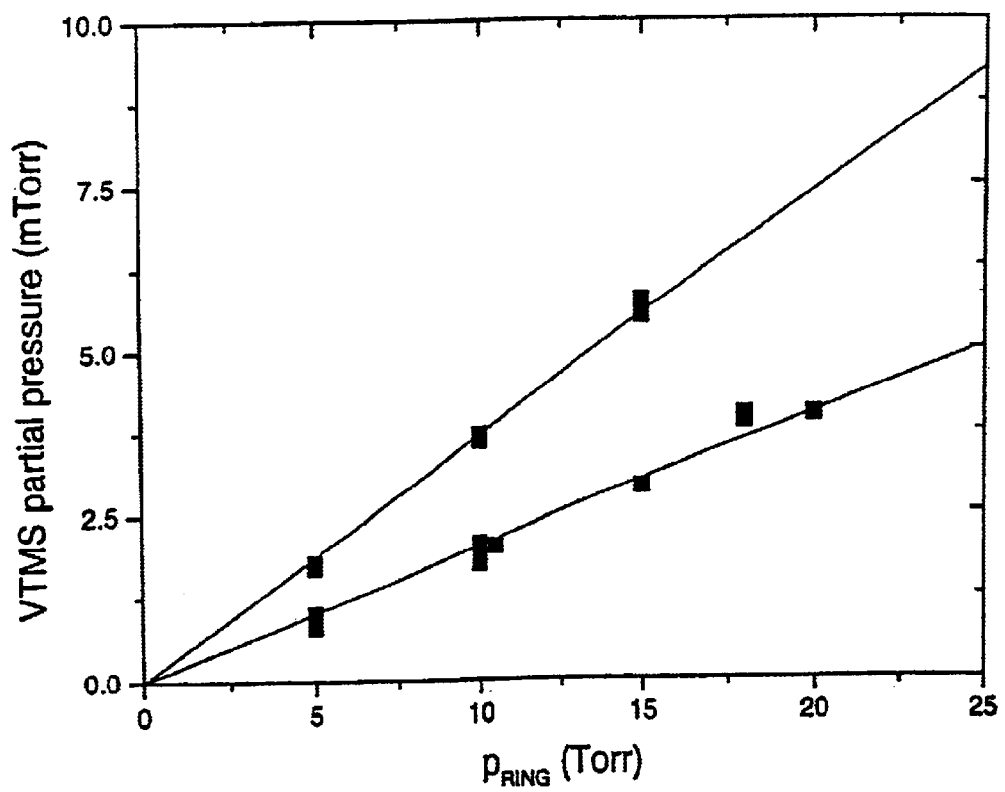
FIG. 6 is a plot of the dependence of reactant gas flow rate upon orifice density of a reactant gas injector.

In another experiment, the flow rate of the reactant gas was reduced by reducing the number of orifices in the injector ring while maintaining the reactant gas pressure in the injection ring at a constant value. The partial pressure of VTMS was measured as a function of pressure within the injector ring for injector rings having 12 and 6 orifices. As seen in FIG. 6, at a given pressure within the injection ring, the greater orifice density results in a greater VTMS partial pressure—i.e., a greater VTMS flow rate. For multiple ETP sources having a single common reactant gas injector ring, the flow rate profile of a reactant gas along the ring can be differentially controlled by varying the linear density of orifices in the injector ring with increases and/or decreases in working distance w. The use of an injector ring having differentially spaced orifices can also accurately compensate for the differences in the working distance w between a substrate and an array of ETP sources to produce a uniform coating on the substrate.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention. For example, the invention is not necessarily limited to the use of an array of multiple ETP sources, but instead be useful in any array of multiple plasma sources that may be used to coat large area, substrates. Similarly, the invention also contemplates the use of reactant gas injector systems that employ combinations of ring injectors, nozzles, and other types of gas inlets.

What is claimed is:

1. An apparatus for depositing a uniform, coating on a surface of a non-planar substrate, said apparatus comprising:
   a) at least one array of a plurality of plasma sources for generating a plurality of plasmas, wherein each of said plurality of plasma sources includes a cathode, an anode, and an inlet for a non-reactive plasma source gas disposed in a plasma chamber which is maintained at a first predetermined pressure;
   b) a deposition chamber for containing said non-planar substrate, wherein said deposition chamber is in fluid communication with said plasma chamber, and wherein said deposition chamber is maintained at a second predetermined pressure, said second predetermined pressure being less than said first predetermined pressure;
   c) at least one reactant gas injector disposed in said deposition chamber between said at least one array and said non-planar substrate for providing a differential flow rate of at least one reactant gas into each of said plurality of plasmas, such that said plurality of plasmas impinges upon a first region of said surface of said non-planar substrate and a second region of said surface of said non-planar substrate to form a coating of substantially uniform thickness, wherein said first region is located at a first working distance from said plurality of plasma sources and said second region is located at a second working distance from said plurality of plasma sources, said first working distance being greater than said second working distance.

2. The apparatus according to claim 1, wherein at least one of said plurality of plasma sources is an expanding thermal plasma source.

3. The apparatus according to claim 1, wherein said at least one array includes at least one three dimensional array of said plurality of plasma sources.

4. The apparatus according to claim 1, wherein said at least one array includes at least one linear array of said plurality of plasma sources.

5. The apparatus according to claim 1, wherein said at least one array includes at least one two dimensional array of said plurality of plasma sources.

6. The apparatus according to claim 1, wherein said first predetermined pressure is at least about 0.1 atmosphere.

7. The apparatus according to claim 6, wherein said first predetermined pressure is about 1 atmosphere.

8. The apparatus according to claim 1, wherein said second predetermined pressure is less than about 1 torr.

9. The apparatus according to claim 1, wherein said second predetermined pressure is less than about 100 millitorr.

10. The apparatus according to claim 1, wherein said plasma source gas comprises at least one of argon, nitrogen, hydrogen, helium, neon, krypton, and xenon.

11. A common reactant gas injector for injecting at least one reactant gas by differential flow into a plurality of plasmas generated by an array of a plurality of plasma sources such that a first flow rate of said reactant gas into a first plasma generated by a first plasma source in said array is different from a second flow rate of said reactant gas into a second plasma generated by a second plasma source in said array, said reactant gas injector comprising:

a) at least one reactant gas inlet comprising a tubular-walled structure having an interior space through which said at least one reactant gas is supplied from a reactant gas source;

b) a first plurality of orifices proximate to said first plasma, each of said first plurality of orifices extending through said tubular-walled structure from said interior space to an outer surface of said reactant gas inlet, wherein said first plurality of orifices is oriented such that said at least one reactant gas passes from said interior space through said first plurality of orifices and is directed into said first plasma at said first flow rate; and c) a second plurality of orifices proximate to said second plasma, each of said second plurality of orifices extending through said tubular-walled structure from said interior space to an outer surface of said at least one reactant gas inlet, wherein said second plurality of orifices is oriented such that said at least one reactant gas passes from said interior space through said second plurality of orifices and is directed into said second plasma at said second flow raze, said second flow rate being different from said first flow rate, such that said plurality of plasmas impinges upon a first region of a surface of a non-planar substrate and a second region of said surface of said non-planar substrate to form a coating of substantially uniform thickness, wherein said first region is located at a first working distance from said plurality of plasma sources and said second region is located at a second working distance from said plurality of plasma sources, said first working distance being greater than said second working distance.

12. The common reactant gas injector according to claim 11, wherein said first plurality of orifices comprises a first predetermined number of orifices and said second plurality of orifices comprises a second predetermined number of orifices.

13. The common reactant gas injector according to claim 12, wherein said first predetermined number is different from said second predetermined number.

14. The common reactant gas injector according to claim 12, wherein each of said first plurality of orifices has a first conductance, and each of said second plurality of orifices has a second conductance, said second conductance being different from said first conductance.

15. The common reactant gas injector according to claim 11, wherein said first plurality of orifices has a first linear density and said second plurality of orifices has a second linear density, wherein said first linear density is different from said second linear density.

16. The common reactant gas injector according to claim 11, wherein said reactant gas injector comprises at least one ring injector.

17. The common reactant gas injector according to claim 11, wherein said reactant gas injector comprises a first reactant gas injector for injecting said reactant gas into said first plasma at a first predetermined flow rate and a second reactant gas injector for injecting said reactant gas into said second plasma at a second predetermined flow rate, wherein said first reactant gas injector is separate from said second reactant gas injector, and wherein at least one of said first predetermined flow rate and said second predetermined flow rate is independently controllable.

18. The common reactant gas injector according to claim 17, wherein said first predetermined flow rate is different from said second predetermined flow rate.

19. An apparatus for depositing a uniform coating on surface of a non-planar substrate, said apparatus comprising:

a) at least one array of a plurality of plasma sources for generating a plurality of plasmas, wherein at least one of said plurality of plasma sources is an expanding thermal plasma source, wherein each of said plurality of plasma sources includes a cathode, an anode, and an inlet for a non-reactive plasma source gas disposed in a plasma chamber which is maintained at a first predetermined pressure;

b) a deposition chamber for containing said non-planar substrate, wherein said deposition chamber is in fluid communication with said plasma chamber, and wherein said deposition chamber is maintained at a second predetermined pressure said second predetermined pressure being less than said first predetermined pressure; and c) at least one common reactant gas injector disposed in said deposition chamber for injecting at least one reactant gas by differential flow into said plurality of plasmas such that a first flow rate of said at least one reactant gas into a first plasma generated by a first plasma source in said at least one array is different from a second flow rate of said at least one reactant gas into a second plasma generated by a second plasma source in said at least one array, said at least one reactor injector comprising: (i) at least one reactant gas inlet comprising a tubular-walled structure having an interior space through which said at least one reactant gas is supplied from a reactant gas source; (ii) a first plurality of orifices proximate to said first plasma, each of said first plurality of orifices extending through said tubular-walled structure from said interior space to an outer surface of said reactant gas inlet, wherein said first plurality of orifices is oriented such that said at least one reactant gas passes from said interior space through said first plurality of orifices and is directed into said first plasma at a first flow rate; and (iii) a second plurality of orifices proximate to said second plasma, each of said second plurality of orifices extending through said tubular-walled structure from said interior space to an outer surface of said at least one reactant gas inlet, wherein said second plurality of orifices is oriented such that said at least one reactant gas passes from said interior space through said second plurality of orifices and is directed into said second plasma at a second flow rate such that said plurality of plasmas impinges upon a first region of said surface of said non-planar substrate and a second region of said surface of said non-planar substrate to form a coating of substantially uniform thickness, wherein said first region is located at a first working distance from said plurality of plasma sources and said second region is located at a second working distance from said plurality of plasma sources, said first working distance being greater than said second working distance.

20. The apparatus according to claim 19, wherein said first plurality of orifices comprises a first predetermined number of orifices and said second plurality of orifices comprises a second predetermined number of orifices.

21. The apparatus according to claim 20, wherein said first predetermined number is different from said second predetermined number.

22. The apparatus according to claim 19, wherein said first plurality of orifices has a first linear density and said second plurality of orifices has a second linear density, wherein said first linear density is different from said second linear density.

23. The apparatus according to claim 19, wherein each of said first plurality of orifices has a first conductance, and each of said second plurality of orifices has a second conductance, said second conductance being different from said first conductance.

24. The apparatus according to claim 19, wherein said common reactant gas injector comprises at least one ring injector.

25. The apparatus according to claim 19, wherein said common reactant gas injector comprises a first reactant gas injector for injecting said reactant gas into said first plasma at a first predetermined flow rate and a second reactant gas injector for injecting said reactant gas into said second plasma at a second predetermined flow rate wherein said first reactant gas injector is separate from said second reactant gas injector, and wherein at least one of said first predetermined flow rate and said second predetermined flow rate is independently controllable.

26. The apparatus according to claim 25, wherein said first predetermined flow rate is different from said second predetermined flow rate.

27. The apparatus according to claim 19, wherein said at least one array includes at least one three dimensional array of said plurality of plasma sources.

28. The apparatus according to claim 19, wherein said at least one array includes at least one linear array of said plurality of plasma sources.

29. The apparatus according to claim 19, wherein said at least one array includes at least one two dimensional array of said plurality of plasma sources.

30. The apparatus according to claim 19, wherein said first predetermined pressure is at least about 0.1 atmosphere.

31. The apparatus according to claim 30, wherein said first predetermined pressure is about 1 atmosphere.

32. The apparatus according to claim 19, wherein said second predetermined pressure is less than about 1 torr.

33. The apparatus according to claim 32, wherein said second predetermined pressure is less than about 100 millitorr.

34. The apparatus according to claim 19, wherein said plasma source gas comprises at least one of argon, nitrogen, hydrogen, helium, neon, krypton, and xenon.

* * * * *